United States Patent
Tseng et al.

(10) Patent No.: US 10,111,323 B2
(45) Date of Patent: Oct. 23, 2018

(54) ELECTRONIC DEVICE AND PRESSURE SENSING MODULE THEREOF

(71) Applicant: Wistron Corporation, New Taipei (TW)

(72) Inventors: Tien-Chung Tseng, New Taipei (TW); Chen-Chieh Lien, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 0 days.

(21) Appl. No.: 15/470,309

(22) Filed: Mar. 27, 2017

(65) Prior Publication Data
US 2018/0063947 A1  Mar. 1, 2018

(30) Foreign Application Priority Data

Aug. 25, 2016  (TW) .............................. 105127330 A (51) Int. Cl.
*G01L 1/10*  (2006.01)
*H05K 1/02*  (2006.01)
(Continued)

(52) U.S. Cl.
CPC .............. *H05K 1/0275* (2013.01); *G01L 1/20* (2013.01); *H05K 1/111* (2013.01); *H05K 5/0047* (2013.01);
(Continued)

(58) Field of Classification Search
CPC .... H05K 1/0275; H05K 1/111; H05K 5/0047; H05K 5/03; H05K 7/1427;
(Continued)

(56) References Cited

U.S. PATENT DOCUMENTS 4,904,197 A * 2/1990 Cabourne ............ H01R 12/721
439/260
5,912,621 A 6/1999 Schmidt
(Continued)

FOREIGN PATENT DOCUMENTS

CN 201004388 Y 1/2008
TW 479165 B 3/2002
(Continued)

OTHER PUBLICATIONS

Office Action dated Jun. 29, 2017 in corresponding TW Application No. 105127330 and partial English translation thereof, 7 pages.

*Primary Examiner* — Max Noori
(74) *Attorney, Agent, or Firm* — Muncy, Geissler, Olds & Lowe, P.C.

(57) ABSTRACT

A pressure sensing module for sensing a pressure applied to a circuit board is disclosed. The pressure sensing module includes a conductive pad, an elastic cover, a pushing part and a conductive unit. The conductive pad is connected to the circuit board. The elastic cover is connected to the circuit board and located on the conductive pad. The elastic cover includes a top end. The pushing part is connected to the top end. The conductive unit is located above the conductive pad. When the pushing part is not under pressure, the conductive unit does not move to touch the conductive pad. When the pushing part is under pressure, the pushing part causes the conductive unit to move toward the conductive pad such that the conductive unit touches the conductive pad.

18 Claims, 10 Drawing Sheets

(51) Int. Cl.
  *H05K 1/11* (2006.01)
  *H05K 5/00* (2006.01)
  *H05K 5/03* (2006.01)
  *H05K 7/14* (2006.01)
  *G01L 1/20* (2006.01)

(52) U.S. Cl.
  CPC .............. *H05K 5/03* (2013.01); *H05K 7/1427* (2013.01); *H05K 2201/09236* (2013.01); *H05K 2201/09263* (2013.01)

(58) Field of Classification Search
  CPC .......... H05K 2201/09236; H05K 2201/09263; G01L 1/20
  USPC ...................................... 73/862.625
  See application file for complete search history.

(56) References Cited

U.S. PATENT DOCUMENTS

| | | | | |
|---|---|---|---|---|
| 9,369,556 B1* | 6/2016 | Wang | ................ | H04M 1/18 |
| 2003/0132027 A1* | 7/2003 | Maruyama | ............... | G01R 3/00 174/267 |
| 2009/0107824 A1* | 4/2009 | Ou | ................ | G06F 3/0202 200/600 |
| 2009/0306485 A1* | 12/2009 | Bell | ................ | A61B 5/04085 600/301 |
| 2013/0161174 A1* | 6/2013 | Li | ................ | H01H 25/041 200/5 B |
| 2015/0133000 A1* | 5/2015 | Kim | ................ | H01R 13/2421 439/700 |
| 2015/0340176 A1 | 11/2015 | Wu | | |

FOREIGN PATENT DOCUMENTS

| | | |
|---|---|---|
| TW | I524367 B | 3/2002 |
| TW | 200807468 A | 2/2008 |
| TW | I320522 B | 2/2010 |

\* cited by examiner

ELECTRONIC DEVICE AND PRESSURE SENSING MODULE THEREOF

BACKGROUND OF THE INVENTION

1. Field of the Invention

The present disclosure relates to a pressure sensing module; more particularly, the present disclosure relates to a pressure sensing module for detecting if the cases of an electronic device are closed.

2. Description of the Related Art

All electronic devices may malfunction after a period of being used, and the user can send the malfunctioning electronic device back to the manufactory for repair services. If the electronic device malfunctions during the warranty period, the user can obtain free repair services. However, some malfunctions of the electronic devices are caused by unauthorized persons opening the upper and lower cases of the electronic device and attempting to modify or repair the electrical components in the electronic device. This kind of malfunction is caused directly or indirectly by the user; thus, even if the user sends this malfunctioning electronic device back to the manufactory for repair service during the warranty period, the user still cannot obtain the free repair service due to a violation of the terms of warranty. To detect if the cases of an electronic device have been opened by a user, a pressure sensing device is installed in the electronic device.

The pressure sensing device of the prior art has a wire and a pressure sensing button. One end of the wire is connected to the pressure sensing button, and the other end of the wire is connected to the circuit board of the electronic device. The pressure sensing button is located on the lower case of the electronic device, facing the upper case. When the upper case and the lower case of the electronic device are closed and combined, the pressure sensing button is depressed by the upper case to generate a sensing signal, and the sensing signal is sent to the circuit board via the wire. Therefore, via continuous reception of the sensing signal, the circuit board can detect that the upper case and the lower case are closed and combined. If the upper case and the lower case are opened and the pressure on the pressure sensing button is thereby removed, the sensing signal is suspended, and the circuit board records that the sensing signal has been suspended for reference by maintenance personnel.

However, the wire of the pressure sensing device of the prior art occupies a large space. When assembly or maintenance personnel assemble or repair the electronic device, the personnel must spend time to arrange the wire to prevent the wire from contacting other components in the electronic device. In addition, to prevent the wire from moving inside the electronic device, there is an additional need to use a fastener to fasten the wire; however, the cost of the fastener increases the cost of the electronic device.

Therefore, there is a need to provide a new pressure sensing module for detecting if the cases of an electronic device are closed or opened to solve the problem of the pressure sensing device of the prior art.

SUMMARY OF THE INVENTION

It is an object of the present disclosure to provide a pressure sensing module for detecting if the cases of an electronic device are closed.

To achieve the abovementioned object, the pressure sensing module of the present disclosure is applied to a circuit board. The pressure sensing module includes a conductive pad, an elastic cover, a pushing part and a conductive unit. The conductive pad is connected to the circuit board. The elastic cover is connected to the circuit board and located above the conductive pad. The elastic cover includes a top end. The pushing part is connected to the top end. The conductive unit is located above the conductive pad. When the pushing part is not under pressure, the conductive unit does not move to touch the conductive pad; when the pushing part is under pressure and moves toward the conductive pad, the pushing part causes the conductive unit to move toward the conductive pad such that the conductive unit touches the conductive pad.

According to the first embodiment of the present disclosure, the conductive pad further includes a first conductive circuit and a second conductive circuit; when the conductive unit touches the conductive pad, the conductive unit touches the first conductive circuit and the second conductive circuit such that the first conductive circuit and the second conductive circuit are electrically connected to each other.

According to the first embodiment of the present disclosure, the first conductive circuit further includes at least one first conductive strip, the second conductive circuit further includes at least one second conductive strip, and the at least one first conductive strip and the at least one second conductive strip are disposed in a staggered configuration.

According to the first embodiment of the present disclosure, the at least one first conductive strip and the at least one second conductive strip are arranged in a parallel configuration or in a spiral configuration.

According to the second embodiment of the present disclosure, the pressure sensing module further includes an elastic unit, and the elastic unit is located between the elastic cover and the conductive pad.

According to the third embodiment of the present disclosure, the pressure sensing module further includes a pressing shell, and the pressing shell is connected to the pushing part.

According to the fourth embodiment of the present disclosure, the pressure sensing module further includes a protection shell, and the protection shell covers the elastic cover.

According to the fourth embodiment of the present disclosure, the protection shell further includes a guiding hole, and the pushing part passes through the guiding hole.

According to the second embodiment of the present disclosure, the elastic unit is a sheet-shaped spring or a coil-shaped spring.

Another object of the present disclosure is to provide an electronic device; a pressure sensing module in the electronic device can detect if the cases of the electronic device are closed.

To achieve the abovementioned object, the electronic device of the present disclosure includes a first case, a second case, a circuit board, a processor and a pressure sensing module. The circuit board is connected to the second case. The processor is connected to the circuit board. The pressure sensing module is used for sensing a pressure applied by the first case. The pressure sensing module includes a conductive pad, an elastic cover, a pushing part and a conductive unit. The conductive pad is connected to the circuit board and electrically connected to the processor. The elastic cover is connected to the circuit board and located above the conductive pad. The elastic cover includes a top end. The pushing part is connected to the top end. The conductive unit is located above the conductive pad. When the first case does not cover the second case, the pushing part is not under the pressure applied by the first case, so the conductive unit does not move to touch the conductive pad. When the first case covers the second case, the first case applies pressure to the pushing part such that the pushing part moves toward the conductive pad and causes the conductive unit to move toward the conductive pad to cause the conductive unit to touch the conductive pad. When the conductive unit touches the conductive pad, the conductive pad sends a conductive information to the processor.

According to the first embodiment of the present disclosure, the conductive pad further includes a first conductive circuit and a second conductive circuit. When the conductive unit touches the conductive pad, the conductive unit touches the first conductive circuit and the second conductive circuit such that the first conductive circuit and the second conductive circuit are electrically connected to each other to send the conductive information to the processor.

DETAILED DESCRIPTION OF THE PREFERRED EMBODIMENT

Figure 1:
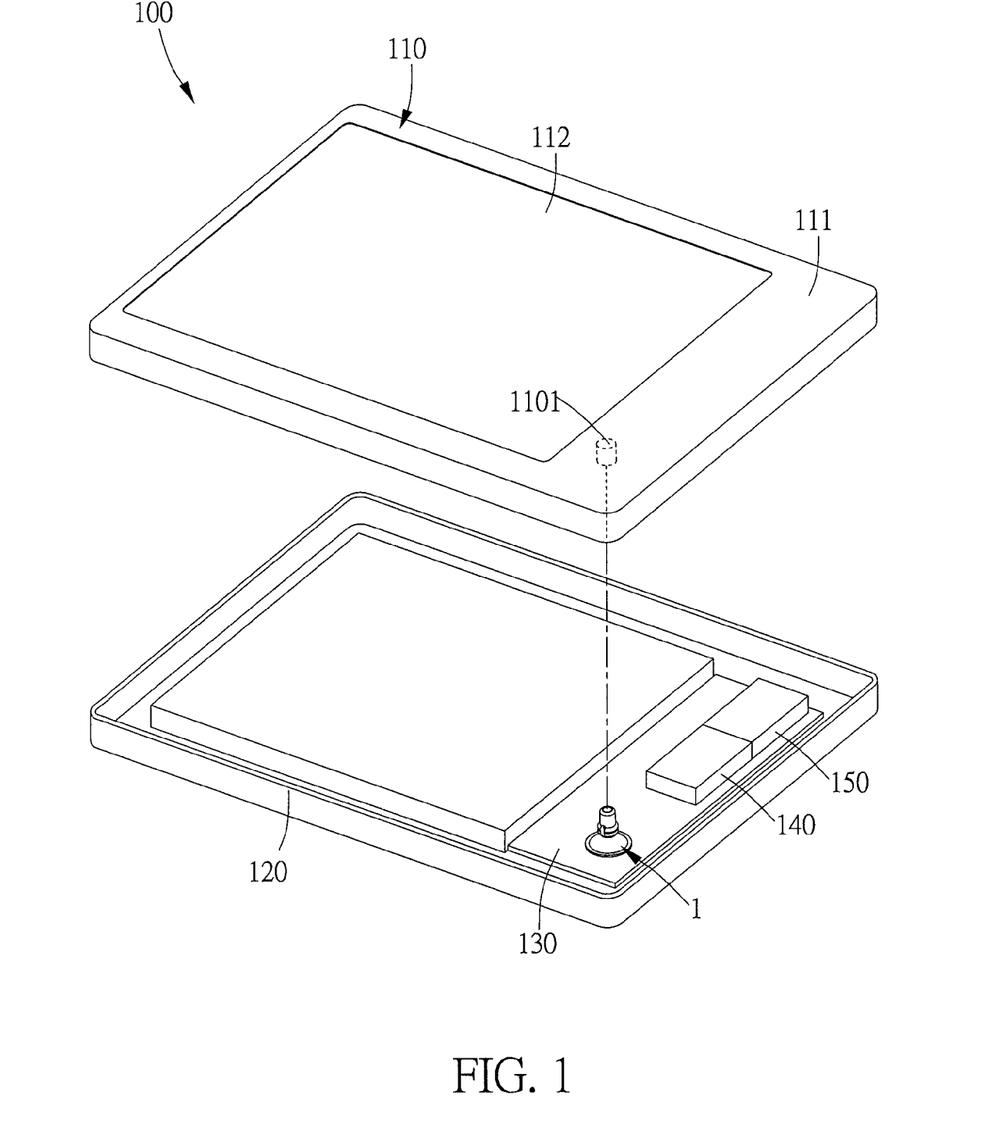
FIG. 1 illustrates a schematic drawing of the first case separated from the second case of the electronic device in the first embodiment of the present disclosure.
Figure 2:
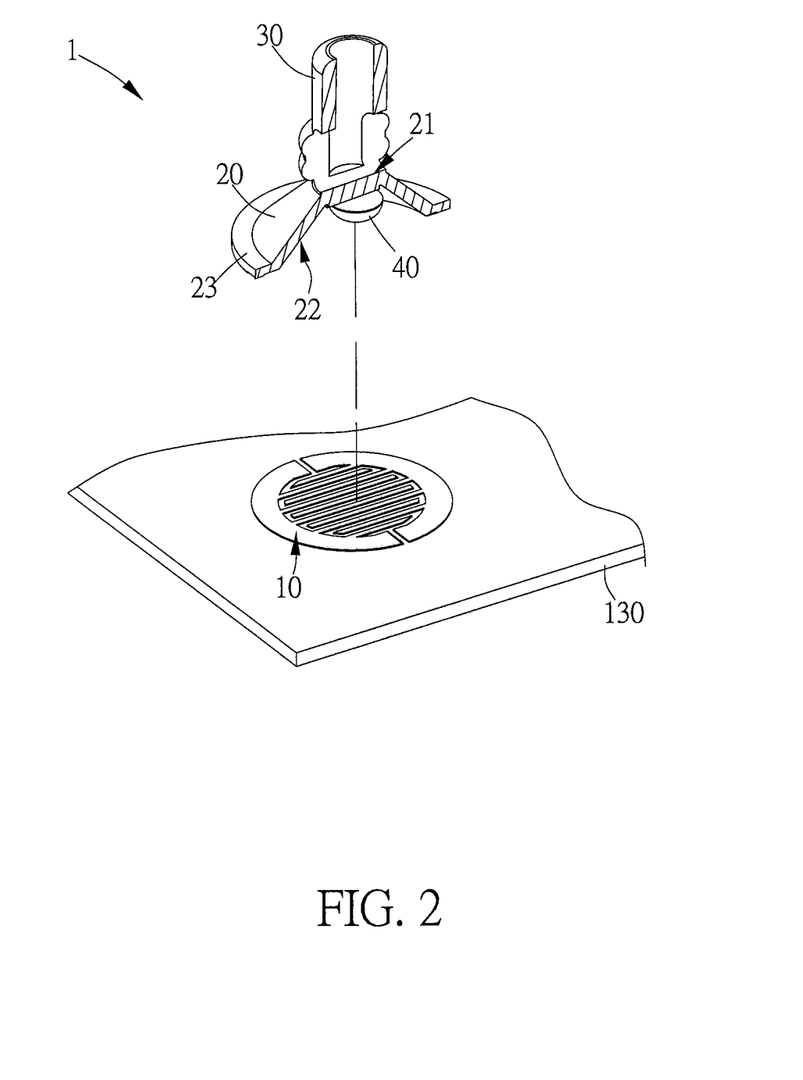
FIG. 2 illustrates a schematic drawing of the pressure sensing module in the first embodiment of the present disclosure.
Figure 3:
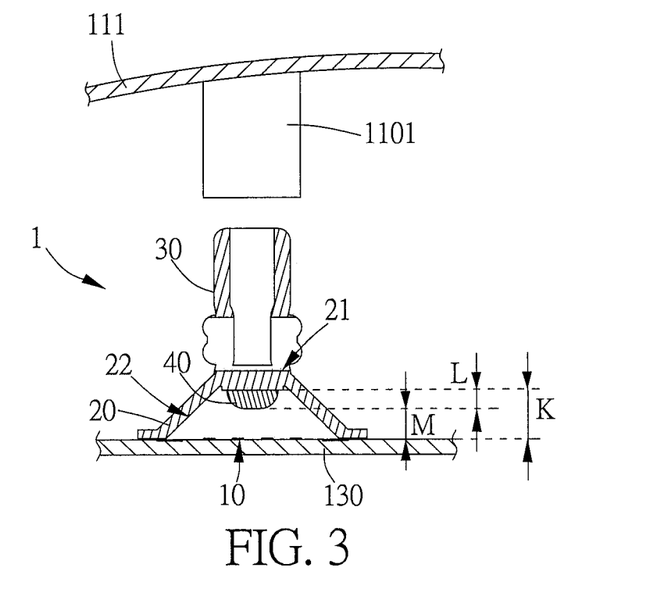
FIG. 3 illustrates a sectional view of the pressure sensing module in the first embodiment of the present disclosure.
Figure 4:
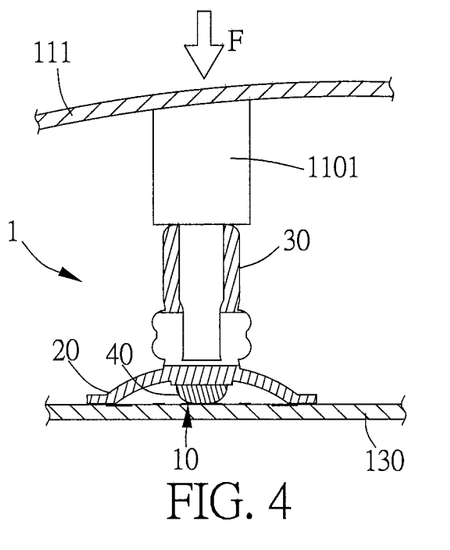
FIG. 4 illustrates a schematic drawing of the pressure sensing module under pressure in the first embodiment of the present disclosure.
Figure 5:
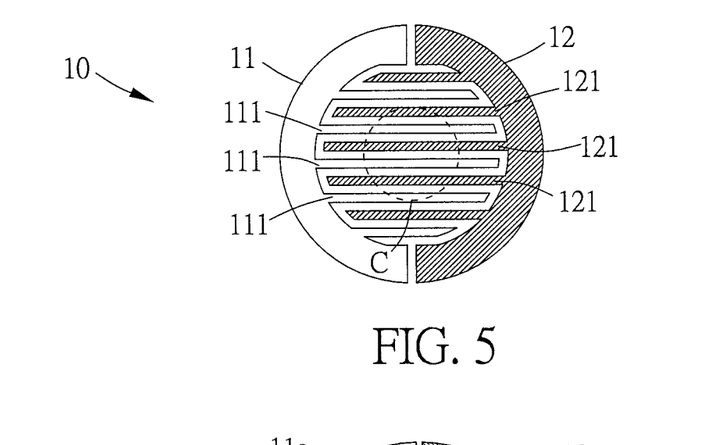
FIG. 5 illustrates a schematic drawing of the conductive pad in the first embodiment of the present disclosure.
Figure 6:
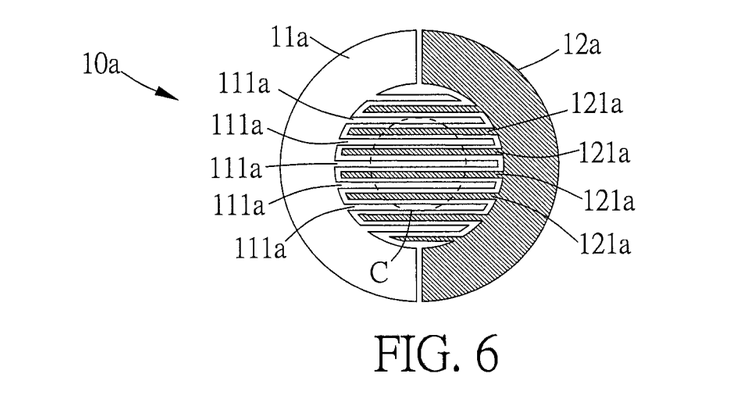
FIG. 6 illustrates a schematic drawing of the first conductive circuit and the second conductive circuit of the conductive pad arranged in the first embodiment of the present disclosure.
Figure 7:
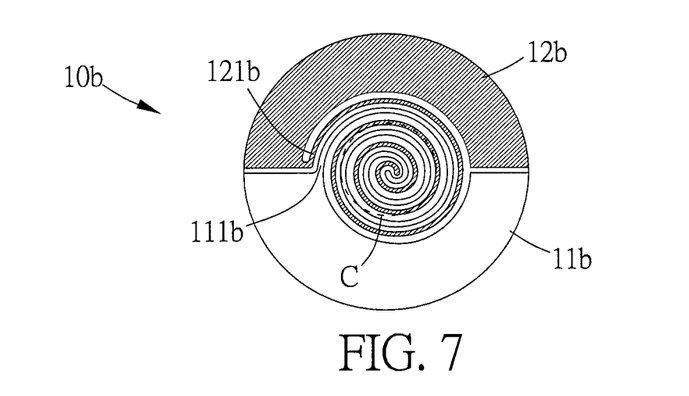
FIG. 7 illustrates a schematic drawing of the first conductive circuit and the second conductive circuit of the conductive pad arranged in a spiral configuration in the first embodiment of the present disclosure.
Figure 8:
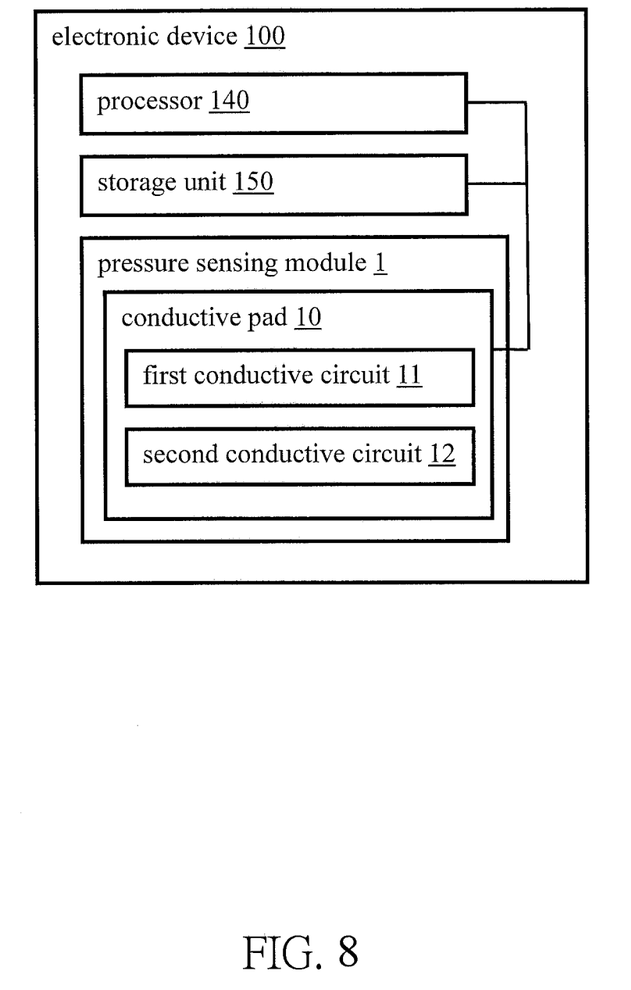
FIG. 8 illustrates a system structure drawing of the pressure sensing module in the first embodiment of the present disclosure.
Figure 9:
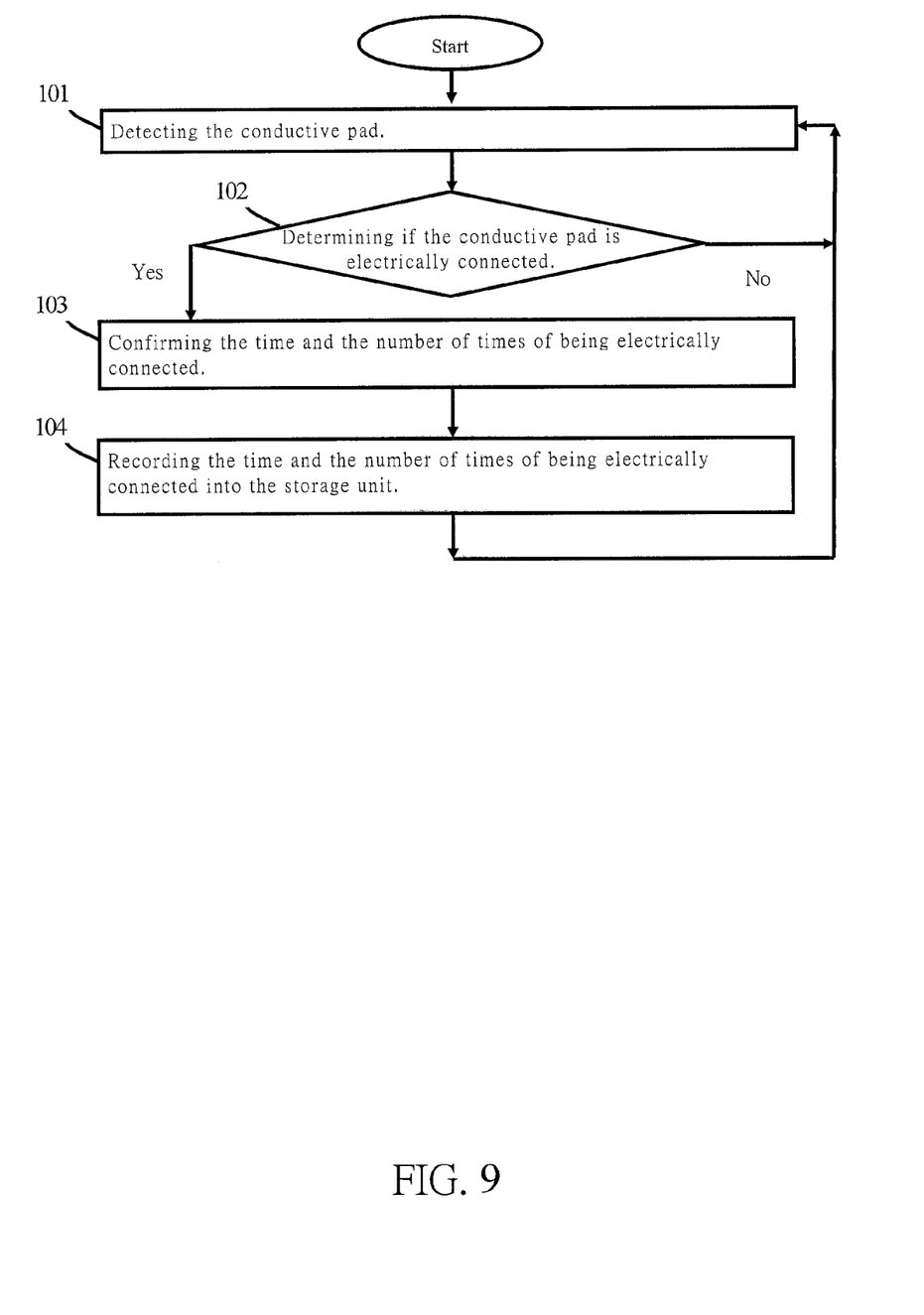
FIG. 9 illustrates a flowchart for the pressure sensing module in the first embodiment of the present disclosure.
Figure 9A:
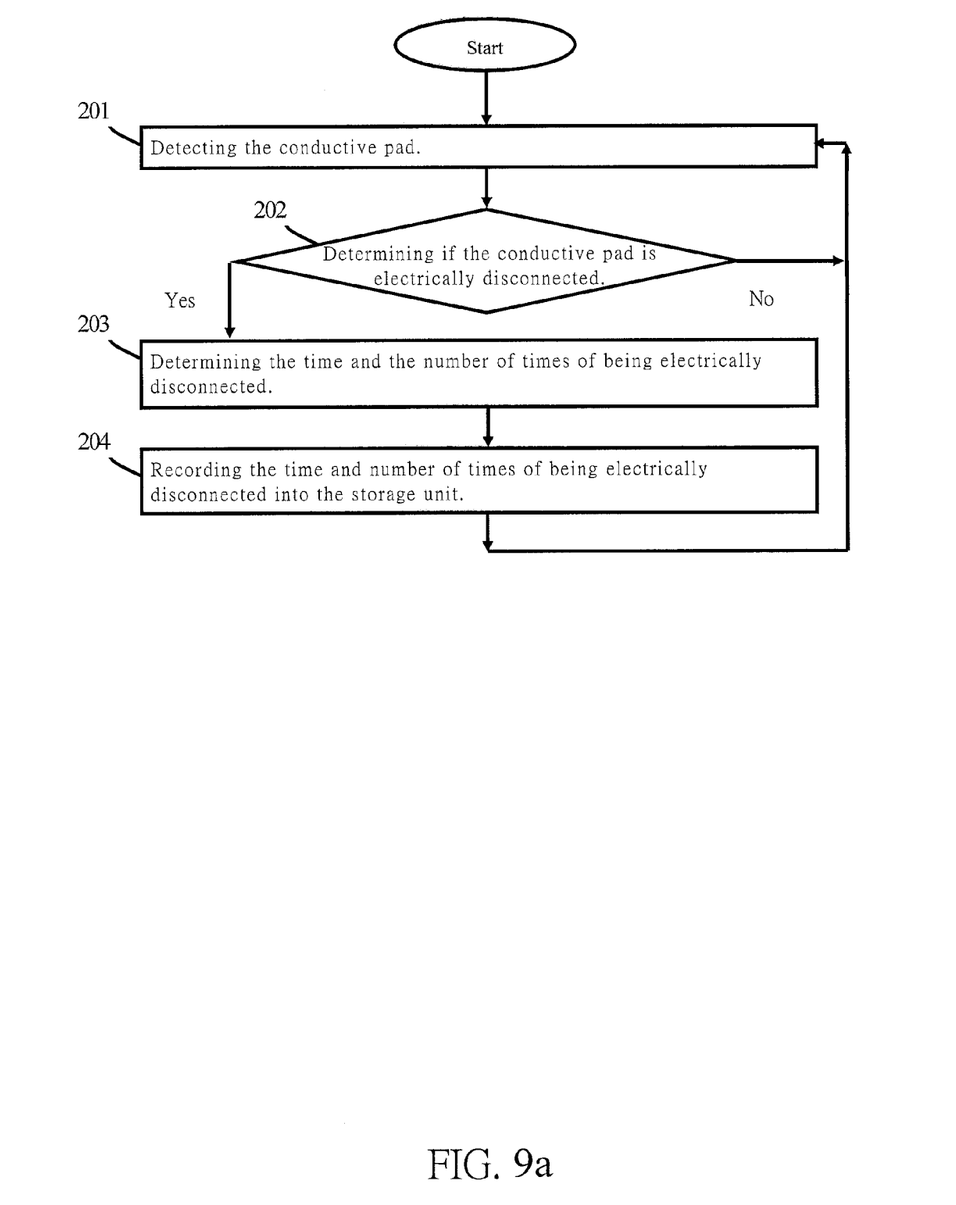
FIG. 9a illustrates another flowchart for the pressure sensing module in the first embodiment of the present disclosure.

Please refer to FIG. 1 to FIG. 9a regarding the pressure sensing module in the first embodiment of the present disclosure. FIG. 1 illustrates a schematic drawing of the first case separated from the second case of the electronic device in the first embodiment of the present disclosure. FIG. 2 illustrates a schematic drawing of the pressure sensing module in the first embodiment of the present disclosure. FIG. 3 illustrates a sectional view of the pressure sensing module in the first embodiment of the present disclosure. FIG. 4 illustrates a schematic drawing of the pressure sensing module under pressure in the first embodiment of the present disclosure. FIG. 5 illustrates a schematic drawing of the conductive pad in the first embodiment of the present disclosure. FIG. 6 illustrates a schematic drawing of the first conductive circuit and the second conductive circuit of the conductive pad arranged in the first embodiment of the present disclosure. FIG. 7 illustrates a schematic drawing of the first conductive circuit and the second conductive circuit of the conductive pad arranged in a spiral configuration in the first embodiment of the present disclosure. FIG. 8 illustrates a system structure drawing of the pressure sensing module in the first embodiment of the present disclosure. FIG. 9 illustrates a flowchart for the pressure sensing module in the first embodiment of the present disclosure. FIG. 9a illustrates another flowchart for the pressure sensing module in the first embodiment of the present disclosure.

In the first embodiment of the present disclosure, as shown in FIG. 1 and FIG. 8, the electronic device 100 can be a liquid crystal display (LCD) screen, a tablet computer, or an All-In-One (AIO) computer; however, the type of the electronic device 100 is not limited to that design and can be any device with a case which can be opened or closed. The electronic device 100 includes a first case 110, a second case 120, a circuit board 130, a processor 140, a storage unit 150 and a pressure sensing module 1.

In the first embodiment of the present disclosure, the first case 110 is an upper case with a screen, and the second case 120 is a lower case. When the first case 110 is combined with the second case 120, a containing space is formed between the first case 110 and the second case 120 for containing the internal components of the electronic device 100. The first case 110 includes a protruding unit 1101, a frame area 111 and a non-frame area 112. The protruding unit 1101 is located on the inside surface of the frame area 111 for pressing the pressure sensing module 1 when the first case 110 is combined with the second case 120 to generate a pressure F on the pressure sensing module 1. The frame area 111 is around the non-frame area 112, and the non-frame area 112 is a hollow containing space for installing the screen glass. The circuit board 130 is connected to the second case 120. The processor 140 is a central processing unit (CPU) which is connected to the circuit board 130 and electrically connected to the storage unit 150 and the pressure sensing module 1 for controlling the storage unit 150 and the pressure sensing module 1 to work. The storage unit 150 is a memory component which is connected to the circuit board 130, and the storage unit 150 is used for storing the pressure sensing software and the requirement data for the pressure sensing module 1.

In the first embodiment of the present disclosure, as shown in FIG. 1 to FIG. 5, the pressure sensing module 1 is used for sensing the pressure F applied by the protruding unit 1101 of the first case 110 when the first case 110 is combined with the second case 120. The pressure sensing module 1 includes a conductive pad 10, an elastic cover 20, a pushing part 30 and a conductive unit 40.

In the first embodiment of the present disclosure, the elastic cover 20 is a bowl-shaped shell made of a flexible material (such as rubber). The elastic cover 20 is connected to the circuit board 130 and located above the conductive pad 10. The elastic cover 20 includes a top end 21, an inner surface 22 and a connecting part 23. There is a first distance K between the top end 21 and the circuit board 130. The inner surface 22 faces toward the conductive pad 10. The connecting part 23 is connected to the circuit board 130. The pushing part 30 is connected to the top end 21 and faces toward the first case 110. The pushing part 30 is used for being pressed by the protruding unit 1101 of the first case 110 and transmitting the pressure F to cause the top end 21 of the elastic cover 20 to move toward the circuit board 130.

In the first embodiment of the present disclosure, the conductive unit 40 can be a conductive rubber, a conductive carbon sheet, a metal block or other conductive object. The conductive unit 40 is connected to the inner surface 22 and the bottom of the top end 21. The conductive unit 40 is located under the pushing part 30 and above the conductive pad 10. The conductive unit 40 is used for touching the conductive pad 10 such that the circuit of the conductive pad 10 is electrically connected. The conductive unit 40 has a conductive unit height L. When the pressure sensing module 1 is not pushed by the pressure F, there is a second distance M between the conductive unit 40 and the conductive pad 10, wherein the second distance M is equal to the first distance K minus the conductive unit height L.

In the first embodiment of the present disclosure, as shown in FIG. 4, FIG. 5 and FIG. 8, the conductive pad 10 is connected to the circuit board 130 and electrically connected to the processor 140. The conductive pad 10 includes a first conductive circuit 11 and a second conductive circuit 12. The first conductive circuit 11 includes a plurality of first conductive strips 111; the second conductive circuit 12 includes a plurality of second conductive strips 121; the plurality of first conductive strips 111 and the plurality of second conductive strips 121 are disposed in a staggered arrangement and arranged in a parallel configuration. When the conductive unit 40 touches the conductive pad 10, the conductive unit 40 touches a part of the first conductive strips 111 of the first conductive circuit 11 and a part of the second conductive strips 121 of the second conductive circuit 12 such that the first conductive circuit 11 and the second conductive circuit 12 can be electrically connected to each other and send a conductive information to the processor 140.

However, the circuit type of the first conductive circuit 11 and the second conductive circuit 12 of the conductive pad 10 are not limited to the circuit type shown in FIG. 5; as shown in FIG. 6, each of the first conductive strips 111a of the first conductive circuit 11a and each of the second conductive strips 121a of the second conductive circuit 12a of the conductive pad 10a can be designed as a conductive strip with a finer width such that each of the first conductive strips 111a and each of the second conductive strips 121a can be arranged more closely in a same unit area. For example, as shown in FIG. 5, when the conductive unit 40 touches the conductive pad 10, a touching area C is formed between the conductive unit 40 and the conductive pad 10, wherein the touching area C covers three first conductive strips 111 and three second conductive strips 121; however, as shown in FIG. 6, when the conductive unit 40 of the same size touches the conductive pad 10a, a touching area C of the same size is also formed between the conductive unit 40 and the conductive pad 10a. At this moment, the touching area C can cover five first conductive strips 111a and four second conductive strips 121a; therefore, in the touching area C of the same size, there are more conductive strips in the closely arranged conductive pad 10a to contact the conductive unit 40 to form the electrical connection, such that the conductive pad 10a has better conductive stability. In addition, the arrangements of the first conductive circuit 11 and the second conductive circuit 12 of the conductive pad 10 are not limited to a parallel configuration. As shown in FIG. 7, the first conductive circuit 11b of the conductive pad 10b has only one spiral-shaped first conductive strip 111b, and the second conductive circuit 12a has only one spiral-shaped second conductive strip 121b. The first conductive strip 111b and the second conductive strip 121b are arranged in a spiral configuration. When the conductive unit 40 of the same size touches the conductive pad 10b, the touching area C of the same size is also formed between the conductive unit 40 and the conductive pad 10b; at this moment, the touching area C completely covers the central area of the spiral-shaped circuit formed by the first conductive strip 111b and the second conductive strip 121b. Therefore, the conductive pad 10b with the spiral-shaped circuit also has great conductive stability.

In the first embodiment of the present disclosure, as shown in FIG. 3, FIG. 5 and FIG. 8, when the first case 110 does not cover the second case 120, the pushing part 30 is not under the pressure F applied by the protruding unit 1101 of the first case 110; at this moment, the conductive unit 40 does not move to touch the conductive pad 10, and the first conductive circuit 11 is not electrically connected to the second conductive circuit 12, so the conductive information is not sent to the processor 140.

However, as shown in FIG. 4, FIG. 5 and FIG. 8, when the first case 110 covers the second case 120, the protruding unit 1101 of the first case 110 applies the pressure F to the pushing part 30 and causes the pushing part 30 to move toward the conductive pad 10 for a distance, and the pushing part 30 also compresses the elastic cover 20 such that the elastic cover 20 is deformed and pushes the conductive unit 40 to move toward the conductive pad 10 for the same distance (the length of the distance is equal to the second distance M), such that the conductive unit 40 touches the first conductive circuit 11 and the second conductive circuit 12 of the conductive pad 10. When the conductive unit 40 touches the first conductive circuit 11 and the second conductive circuit 12 of the conductive pad 10, the first conductive circuit 11 is electrically connected to the second conductive circuit 12 to generate a conductive information, and the conductive pad 10 continuously sends the conductive information to the processor 140. If the combined first case 110 and second case 120 are separated again, the deformed elastic cover 20 is restored to the original bowl shape via its elasticity (as shown in FIG. 3); at this moment, the bowl-shaped elastic cover 20 causes the conductive unit 40 to return to the original height such that the conductive unit 40 is separated from the conductive pad 10. It is to be known that, if the user places the first case 110 on the second case 120 only lightly and does not apply any force to the first case 110, such that the first case 110 does not cover and combine with the second case 120 tightly, the moving distance that the pushing part 30 causes the conductive unit 40 to move may be less than the second distance M; therefore, although the conductive unit 40 will move toward the conductive pad 10, the conductive unit 40 will not move a sufficient distance to touch the conductive pad 10.

In the first embodiment of the present disclosure, as shown in FIG. 3 to FIG. 5, FIG. 8 and FIG. 9, the electronic device 100 of the present disclosure loads and executes the pressure sensing software stored in the storage unit 150, and the pressure sensing software works with the pressure sensing module 1 to determine if the pressure F exists so as to determine if the first case 110 and the second case 120 are separated. When the electronic device 100 loads and executes the pressure sensing software stored in the storage unit 150, the following steps are processed.

First, executing Step 101: detecting the conductive pad.

In the first embodiment of the present disclosure, when the first case 110 and the second case 120 are combined, the protruding unit 1101 pushes the pushing part 30 and applies the pressure F to the pushing part 30 to cause the pushing part 30 to move toward the conductive pad 10 for a distance, and the pushing part 30 also causes the conductive unit 40 to move toward the conductive pad 10 for the same distance (the length of the distance is equal to the second distance M) such that the conductive unit 40 touches the first conductive circuit 11 and the second conductive circuit 12 of the conductive pad 10. When the conductive unit 40 touches the first conductive circuit 11 and the second conductive circuit 12 of the conductive pad 10, the first conductive circuit 11 and the second conductive circuit 12 are electrically connected to each other to generate a conductive information, and the conductive pad 10 continuously sends the conductive information to the processor 140. Therefore, via detecting the conductive information sent from the conductive pad 10, the processor 140 can determine if the first conductive circuit 11 and the second conductive circuit 12 are touched by the conductive unit 40 which is pushed by the pressure F to further determine if the first case 110 and the second case 120 are combined such that the protruding unit 1101 applies the pressure F to the pushing part 30.

Then, executing Step 102: determining if the conductive pad is electrically connected.

After the processor 140 receives the conductive information sent from the conductive pad 10, the processor 140 continuously determines and records if the conductive pad 10 is electrically connected. If the processor 140 continuously receives the conductive information sent from the conductive pad 10, then the processor 140 determines that the conductive pad 10 is electrically connected, and the processor 140 further determines that the first case 110 and the second case 120 are still combined with each other and that the first case 110 is continuously applying the pressure F to the pushing part 30 such that the conductive pad 10 generates the conductive information; if the processor 140 determines that the conductive information of the conductive pad 10 is not stopped, this determination represents that the first case 110 and the second case 120 are not separated; at this moment, Step 103 is executed: confirming the time and the number of times of being electrically connected.

If the processor 140 stops receiving the conductive information sent from the conductive pad 10, the processor 140 determines that the conductive pad 10 is electrically disconnected, and the processor 140 further determines that the first case 110 and the second case 120 are separated such that the first case 110 does not apply the pressure F to the pushing part 30 and the conductive pad 10 does not generate the conductive information; at this moment, the process returns to Step 101 to continue detecting the conductive pad 10.

When the processor 140 determines that the conductive pad 10 is electrically connected and executes Step 103, the processor 140 instantly verifies the conduction time information (such as the date or detailed time) of the conductive pad 10; if the conductive pad 10 has been electrically connected several times, the processor 140 can also verify the number of times of being electrically connected.

Finally, executing Step 104: recording the time and the number of times of being electrically connected into the storage unit.

After the processor 140 determines the time and the number of times of being electrically connected of the conductive pad 10, the processor 140 sends the information of the time and the number of times of being electrically connected to the storage unit 150, and the storage unit 150 records the information of the time and the number of times of being electrically connected. Therefore, in the future, if maintenance personnel need to maintain the electronic device 100, the maintenance personnel will be able to obtain easily the information of the time and the number of times of being electrically connected from the storage unit 150 so as to know the time and the number of times that the conductive pad 10 has been electrically connected, and further to determine if the first case 110 and the second case 120 of the electronic device 100 have been separated, and the time and the number of times of separation, to determine whether the electronic device 100 has been disassembled.

However, the working method of the pressure sensing software of the present disclosure can also be changed as shown in FIG. 9a. In the working method shown in FIG. 9a, the Step 201 and the Step 101 shown in FIG. 9 are the same; the difference between the two working methods are Step 202 to Step 204. In the working method shown in FIG. 9a, after Step 201 is executed, the processor executes Step 202: determining if the conductive pad is electrically disconnected.

In Step 202, after the processor 140 receives the conductive information sent from the conductive pad 10, the processor 140 continuously determines and records if the conductive pad 10 is electrically disconnected. If the processor 140 continuously receives the conductive information sent from the conductive pad 10, then the processor 140 determines that the conductive pad 10 is electrically disconnected; then the process returns to Step 201.

However, if the processor 140 stops receiving the conductive information sent from the conductive pad 10, the processor 140 determines that the conductive pad 10 is electrically disconnected, and the processor 140 further determines that the first case 110 and the second case 120 are separated such that the first case 110 does not apply the pressure F to the pushing part 30, and the conductive pad 10 cannot generate the conductive information; at this moment, Step 203 is executed.

After the processor 140 determines that the conductive pad 10 is electrically disconnected, the processor executes Step 203: determining the time and the number of times of being electrically disconnected.

After the processor 140 determines that the conductive pad 10 is electrically disconnected, the processor 140 instantly verifies the electrical disconnection time information of the conductive pad 10 (such as the date and the detailed time); if the conductive pad 10 has been electrically disconnected several times, the processor 140 also verifies the number of times of being electrically disconnected.

Finally, executing Step 204: recording the time and number of times of being electrically disconnected into the storage unit.

After the processor 140 determines the time and number of times of being electrically disconnected of the conductive pad 10, the processor 140 sends the time and number of times of being electrically disconnected to the storage unit 150, and the storage unit 150 records the time and number of times of being electrically disconnected. Therefore, in the future, if maintenance personnel need to maintain this electronic device 100, the maintenance personnel will be able to obtain easily the information of the time and number of times of being electrically disconnected recorded in the storage unit 150 so as to know the time and the number of times that the conductive pad 10 has been electrically disconnected and thereby further determine if the first case 110 and the second case 120 of the electronic device 100 have been separated, and the time and the number of times of separation, to determine if the electronic device 100 has been disassembled.

It is to be known that the working method of the pressure sensing software shown in FIG. 9 detects if the first conductive circuit 11 and the second conductive circuit 12 are electrically connected, and that the working method of the pressure sensing software shown in FIG. 9a is opposite to the working method of the pressure sensing software shown in FIG. 9; the working method of the pressure sensing software shown in FIG. 9a detects if the first conductive circuit 11 and the second conductive circuit 12 are electrically disconnected. The abovementioned two working methods can both be saved in the storage unit 150, and the user can choose either one of the working methods according to personal usage habits.

Figure 10:
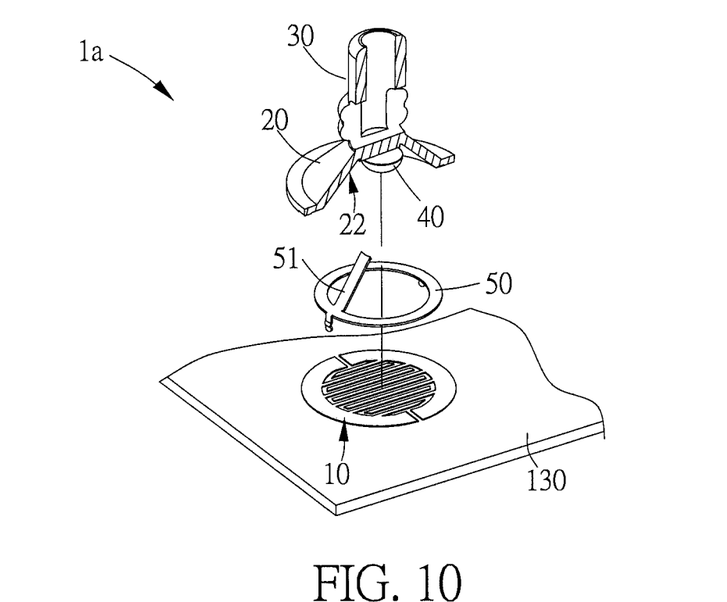
FIG. 10 illustrates a schematic drawing of the pressure sensing module in the second embodiment of the present disclosure.
Figure 11:
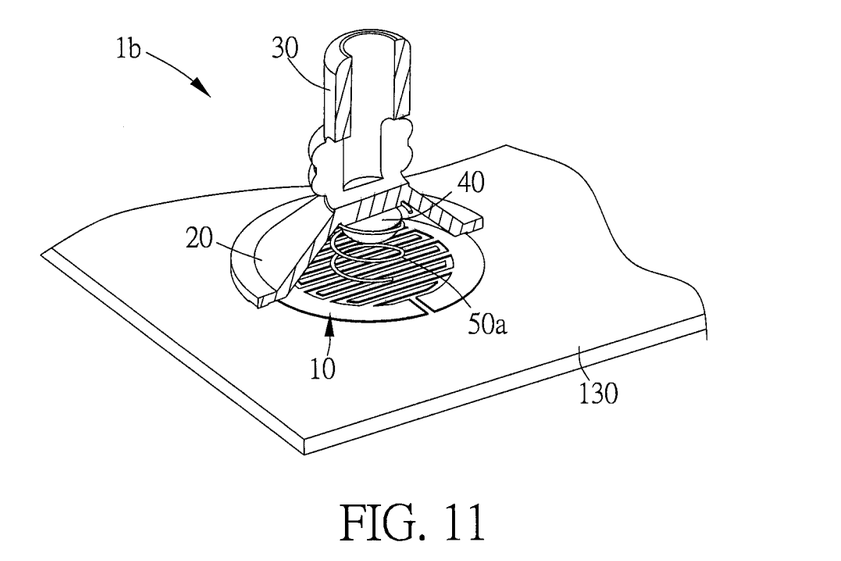
FIG. 11 illustrates a schematic drawing of a pressure sensing module of another type in the second embodiment of the present disclosure.

Please refer to FIG. 10 to FIG. 11 regarding the pressure sensing module in the second embodiment of the present disclosure. FIG. 10 illustrates a schematic drawing of the pressure sensing module in the second embodiment of the present disclosure. FIG. 11 illustrates a schematic drawing of the pressure sensing module of another type in the second embodiment of the present disclosure.

As shown in FIG. 10, the difference between the first embodiment and the second embodiment of the present disclosure is that, in the second embodiment, the pressure sensing module 1a further includes an elastic unit 50. The elastic unit 50 is located between the elastic cover 20 and the conductive pad 10. The elastic unit 50 is used for applying elastic force to the elastic cover 20. Via the elastic force of the elastic unit 50, when the first case 110 and the second case 120 are separated, the deformed elastic cover 20 can be restored to the original undeformed bowl shape more quickly such that the conductive unit 40 and the conductive pad 10 can be separated quickly. The elastic unit 50 can be a sheet spring, and the elastic unit 50 has a supporting sheet 51. The supporting sheet 51 is used for touching the inner surface 22 to provide the elastic force from the inner side of the elastic cover 20. However, the type of the elastic unit 50 is not limited to the sheet spring; as shown in FIG. 11, the elastic unit 50a can also be a coil spring. The elastic unit 50a can be disposed between the elastic cover 20 and the conductive pad 10 such that the deformed elastic cover 20 can be restored to the original undeformed bowl shape more quickly.

Figure 12:
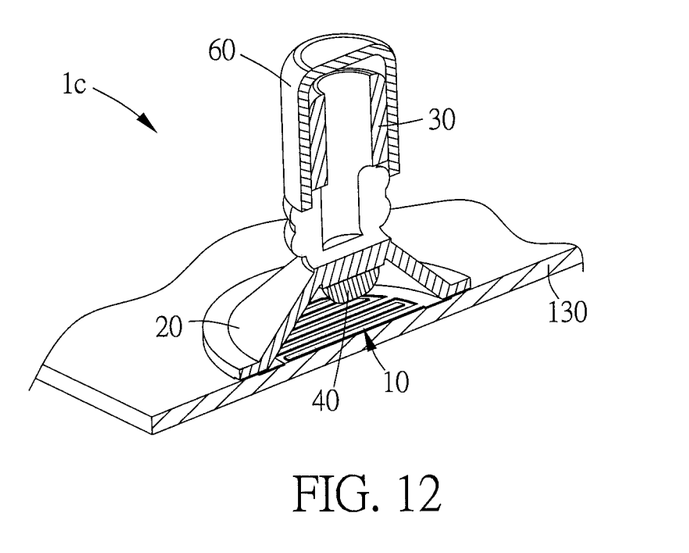
FIG. 12 illustrates a schematic drawing of the pressure sensing module in the third embodiment of the present disclosure.

Please refer to FIG. 12 regarding the pressure sensing module in the third embodiment of the present disclosure. FIG. 12 illustrates a schematic drawing of the pressure sensing module in the third embodiment of the present disclosure.

As shown in FIG. 12, the difference between the first embodiment and the third embodiment of the present disclosure is that, in the third embodiment, the pressure sensing module 1c further includes a pressing shell 60. The pressing shell 60 is a hard shell (such as a plastic shell) and is connected to the outside of the pushing part 30. The pressing shell 60 is used for increasing the area of the pressure applied by the pushing part 30 such that the pushing part 30 can more easily deform the elastic cover 20 to cause the conductive unit 40 to move toward the conductive pad 10.

Figure 13:
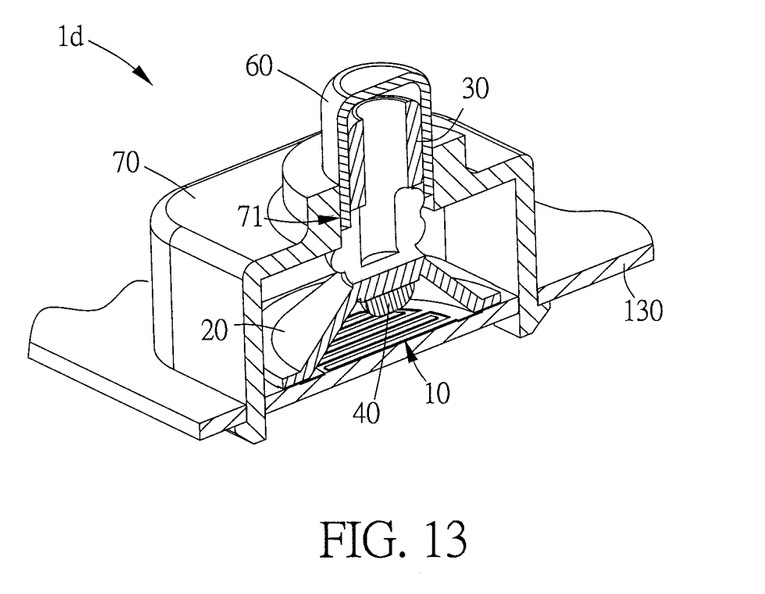
FIG. 13 illustrates a schematic drawing of the pressure sensing module in the fourth embodiment of the present disclosure.

Please refer to FIG. 13 regarding the pressure sensing module in the fourth embodiment of the present disclosure. FIG. 13 illustrates a schematic drawing of the pressure sensing module in the fourth embodiment of the present disclosure.

As shown in FIG. 13, the difference between the third embodiment and the fourth embodiment of the present disclosure is that, in the fourth embodiment, the pressure sensing module 1d further includes a protection shell 70. The protection shell 70 is a hard shell (such as a plastic case) and covers the elastic cover 20 to protect the elastic cover 20; the conductive pad 10 and the conductive unit 40 are disposed under the elastic cover 20. The protection shell 70 includes a guiding hole 71, and the pushing part 30 passes through the guiding hole 71. The guiding hole 71 can provide an effect of guiding the direction of movement of the pushing part 30 to cause the pushing part 30 to move along the opening direction of the guiding hole 71 to push the elastic cover 20 to cause the conductive unit 40 to move toward the conductive pad 10.

Figure 14:
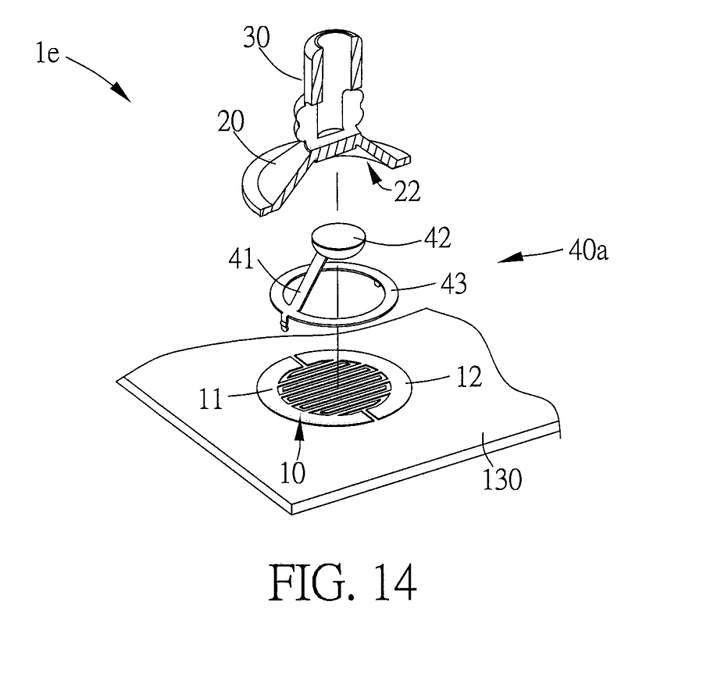
FIG. 14 illustrates a schematic drawing of the pressure sensing module in the fifth embodiment of the present disclosure.

Please refer to FIG. 14 regarding the pressure sensing module in the fifth embodiment of the present disclosure. FIG. 14 illustrates a schematic drawing of the pressure sensing module in the fifth embodiment of the present disclosure.

As shown in FIG. 14, the difference between the first embodiment and the fifth embodiment of the present disclosure is that, in the fifth embodiment, the conductive unit 40a includes a connecting sheet 41, a conductive block 42 and a supporting part 43. The conductive block 42 is an object made of a conductive material (such as metal). The conductive block 42 is connected to the connecting sheet 41. The conductive block 42 is used for touching the conductive pad 10 such that the first conductive circuit 11 and the second conductive circuit 12 of the conductive pad 10 are electrically connected to each other. The supporting part 43 is made of a non-conductive material (such as non-conductive rubber). The supporting part 43 is connected to the connecting sheet 41, and the supporting part 43 is located above the conductive pad 10 for supporting the connecting sheet 41 and the conductive block 42. Because the supporting part 43 is made of a non-conductive material, the supporting part 43 located above the conductive pad 10 does not allow the first conductive circuit 11 and the second conductive circuit 12 of the conductive pad 10 to be electrically connected to each other. The connecting sheet 41 is located between the conductive block 42 and the supporting part 43. The connecting sheet 41 is made of an elastic material (such as rubber). The connecting sheet 41 is used for being pushed by the inner surface 22 to bend toward the conductive pad 10 when the pushing part 30 moves toward the conductive pad 10 to cause the conductive block 42 to touch the conductive pad 10 such that the first conductive circuit 11 and the second conductive circuit 12 of the conductive pad 10 are electrically connected to each other (or to cause the first conductive circuit 11a and the second conductive circuit 12a of the conductive pad 10a shown in FIG. 6 to be electrically connected to each other, or to cause the first conductive circuit 11b and the second conductive circuit 12b of the conductive pad 10b shown in FIG. 7 to be electrically connected to each other). Because the connecting sheet 41 has elasticity, the connecting sheet 41 can also provide the elasticity from the inner side of the elastic cover 20 to cause the deformed elastic cover 20 to be restored to the original undeformed bowl shape more quickly.

Via the structure design of the pressure sensing modules 1, 1a, 1b, 1c, 1d, 1e of the present disclosure, the pressure sensing modules 1, 1a, 1b, 1c, 1d, 1e do not have any wires, so the pressure sensing modules 1, 1a, 1b, 1c, 1d, 1e occupy less space; for the assembly personnel, the time of assembling the wire for the pressure sensing modules 1, 1a, 1b, 1c, 1d, 1e can be eliminated to achieve the effect of eliminating the cost of the wire and the time of assembly. Moreover, the pressure sensing modules 1, 1a, 1b, 1c, 1d, 1e can be used for detecting if the cases of the electronic device 100 have been opened, and the pressure sensing modules 1, 1a, 1b, 1c, 1d, 1e can record the time and the number of times that the cases are opened so that maintenance personnel can determine if the electronic device 100 has been disassembled.

In summary, regardless of the purposes, means and effectiveness, this disclosure is quite different from the known technology and should merit the issuing of a new patent. However, it is noted that many of the above-mentioned embodiments are only for illustrative purposes; the claims of the disclosure should depend on the claims and not be limited to the embodiments.

What is claimed is:

1. A pressure sensing module, applied to an electronic device, wherein the electronic device comprises a first case, a second case, a circuit board, and a processor, the circuit board is connected to the second base, the processor is connected to the circuit board, the pressure sensing module sensing a pressure applied by the first case comprising:
   a conductive pad, connected to the circuit board and electrically connected to the processor;
   an elastic cover, connected to the circuit board and located above the conductive pad, wherein the elastic cover comprises a top end;
   a pushing part, connected to the top end; and
   a conductive unit, located above the conductive pad;
   wherein, when the first case does not cover the second case, the pushing part is not under pressure, and the conductive unit does not move to touch the conductive pad;
   wherein, when the first case covers the second case and the first case applies pressure to the pushing part, the pushing part is under pressure and moves toward the conductive pad, and the pushing part causes the conductive unit to move toward the conductive pad such that the conductive unit touches the conductive pad; and
   wherein, when the conductive unit touches the conductive pad, the conductive pad sends a conductive information to the processor.

2. The pressure sensing module as claimed in claim 1, wherein the conductive pad further comprises a first conductive circuit and a second conductive circuit; when the conductive unit touches the conductive pad, the conductive unit touches the first conductive circuit and the second conductive circuit such that the first conductive circuit and the second conductive circuit are electrically connected to each other.

3. The pressure sensing module as claimed in claim 2, wherein the first conductive circuit further comprises at least one first conductive strip, the second conductive circuit further comprises at least one second conductive strip, and the at least one first conductive strip and the at least one second conductive strip are disposed in a staggered arrangement.

4. The pressure sensing module as claimed in claim 3, wherein the at least one first conductive strip and the at least one second conductive strip are arranged in a parallel configuration or in a spiral configuration.

5. The pressure sensing module as claimed in claim 4, further comprising an elastic unit, and the elastic unit is located between the elastic cover and the conductive pad.

6. The pressure sensing module as claimed in claim 5, further comprising a pressing shell, and the pressing shell is connected to the pushing part.

7. The pressure sensing module as claimed in claim 6, further comprising a protection shell, and the protection shell covers the elastic cover.

8. The pressure sensing module as claimed in claim 7, wherein the protection shell further comprises a guiding hole, and the pushing part passes through the guiding hole.

9. The pressure sensing module as claimed in claim 8, wherein the elastic unit is a sheet-shaped spring or a coil-shaped spring.

10. An electronic device, comprising:
    a first case;
    a second case;
    a circuit board, connected to the second case;
    a processor, connected to the circuit board; and
    a pressure sensing module, for sensing a pressure applied by the first case, wherein the pressure sensing module comprises:
    a conductive pad, connected to the circuit board and electrically connected to the processor;
    an elastic cover, connected to the circuit board and located above the conductive pad, wherein the elastic cover comprises a top end;
    a pushing part, connected to the top end; and
    a conductive unit, located above the conductive pad;
    wherein when the first case does not cover the second case, the pushing part is not under the pressure applied by the first case, such that the conductive unit does not move to touch the conductive pad; when the first case covers the second case and the first case applies pressure to the pushing part, the pushing part moves toward the conductive pad and causes the conductive unit to move toward the conductive pad such that the conductive unit touches the conductive pad; when the conductive unit touches the conductive pad, the conductive pad sends a conductive information to the processor.

11. The electronic device as claimed in claim 10, wherein the conductive pad further comprises a first conductive circuit and a second conductive circuit; when the conductive unit touches the conductive pad, the conductive unit touches the first conductive circuit and the second conductive circuit to cause the first conductive circuit and the second conductive circuit to be electrically connected to each other to send the conductive information to the processor.

12. The electronic device as claimed in claim 11, wherein the first conductive circuit further comprises at least one first conductive strip, the second conductive circuit further comprises at least one second conductive strip, and the at least one first conductive strip and the at least one second conductive strip are disposed in a staggered arrangement.

13. The electronic device as claimed in claim 12, wherein the at least one first conductive strip and the at least one second conductive strip are arranged in a parallel configuration or in a spiral configuration.

14. The electronic device as claimed in claim 13, wherein the pressure sensing module further comprises an elastic unit, and the elastic unit is located between the elastic cover and the conductive pad.

15. The electronic device as claimed in claim 14, wherein the pressure sensing module further comprises a pressing shell, and the pressing shell is connected to the pushing part.

16. The electronic device as claimed in claim 15, wherein the pressure sensing module further comprises a protection shell, and the protection shell covers the elastic cover.

17. The electronic device as claimed in claim 16, wherein the protection shell further comprises a guiding hole, and the pushing part passes through the guiding hole.

18. The electronic device as claimed in claim 17, wherein the elastic unit is a sheet-shaped spring or a coil-shaped spring.

* * * * *